(12) United States Patent
Miller

(10) Patent No.: US 6,208,225 B1
(45) Date of Patent: Mar. 27, 2001

(54) FILTER STRUCTURES FOR INTEGRATED CIRCUIT INTERFACES

(75) Inventor: Charles A. Miller, Fremont, CA (US)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 09/258,184

(22) Filed: Feb. 25, 1999

(51) Int. Cl.$^7$ ................. H01P 1/20; H01P 1/00; H03H 7/00; H03H 5/00
(52) U.S. Cl. ............ 333/202; 333/204; 333/24 C; 333/167; 333/260
(58) Field of Search ................. 333/202, 204, 333/167, 175, 24 R, 24 C, 32, 33, 34, 35, 245, 246, 260

(56) References Cited

U.S. PATENT DOCUMENTS

| | | | |
|---|---|---|---|
| 4,342,013 | * 7/1982 | Kallman | 333/181 |
| 4,472,725 | * 9/1984 | Blumenkranz | 333/139 |
| 5,270,673 | * 12/1993 | Fries et al. | 333/246 |
| 5,424,693 | 6/1995 | Lin | 333/33 |
| 5,532,506 | * 7/1996 | Tserng | 257/276 |
| 6,008,533 | 12/1999 | Bruce et al. | 257/691 |

OTHER PUBLICATIONS

W.H. Hayward, Introduction to Radio Frequency Design, Prentice Hall, Inc., 1982, Englewood Cliffs, New Jersey, pp. 59–68.

* cited by examiner

Primary Examiner—Robert Pascal
Assistant Examiner—Patricia T. Nguyen
(74) Attorney, Agent, or Firm—Daniel J. Bedell; Smith-Hill and Bedell

(57) ABSTRACT

A method of optimizing the frequency response of an interconnect system of the type which conveys high frequency signals between bond pads of separate integrated circuits (ICs) mounted on a printed circuit board (PCB) through inductive conductors, such as bond wires and package legs, and a trace on the surface of the PCB. To improve the interconnect system, capacitance is added to the trace and inductance is added to the conductors, with the added trace capacitance and conductor inductance being appropriately sized relative to one another and to various other interconnect system impedances to optimize the interconnect system impedance matching frequency response.

39 Claims, 2 Drawing Sheets

FILTER STRUCTURES FOR INTEGRATED CIRCUIT INTERFACES

CROSS-REFERENCE TO RELATED APPLICATIONS

The subject matter of the present application is related to that of copending U.S. application INTEGRATED CIRCUIT INTERCONNECT SYSTEM, Application Ser. No. 9/258,185, filed concurrently herewith.

The subject matter of the present application is also related to that of copending U.S. application HIGH BANDWIDTH PASSIVE INTEGRATED CIRCUIT TESTER PROBE CARD ASSEMBLY, Application No. 09/258/86, filed concurrently herewith.

BACKGROUND OF THE INVENTION

1. Field of the Invention

The present invention relates in general to systems for interconnecting integrated circuits mounted on a circuit board and in particular to an interconnect system that provides a filter and impedance matching function.

2. Description of Related Art

Each node of an integrated circuit (IC) that is to communicate with external circuits is linked to a bond pad on the surface of the IC chip. In a packaged IC a bond wire typically connects the bond pad to a conductive leg extending from the package surrounding the IC chip. When the IC is mounted on a printed circuit board (PCB), the package leg is soldered to a microstrip PCB trace on the surface of the PCB. When bond pads of one or more other ICs mounted on the PCB are linked to the PCB trace, the bond pads, bond wires, package legs, and the PCB trace form an interconnect system for conveying signals between nodes of two or more ICs.

In high frequency applications the interconnect system can attenuate and distort signals. The conventional approach to reducing the amount of signal distortion and attenuation caused by the interconnect system has been to minimize the series inductance and shunt capacitance of the interconnect system. Much of the inductance comes from the bond wire and the package leg, and such inductance can be minimized by keeping the bond wire and package leg as short as possible. The capacitance of the bond pads can be reduced to some extent by minimizing the surface area of the bond pads. The capacitance of PCB traces can be reduced by appropriately choosing physical characteristics of the board including the size of the PCB traces, their spacing from ground planes and dielectric nature of the insulating material forming the circuit board. Vias, conductors passing vertically through a circuit board to interconnect PCB traces on various layers of the PCB, can be a source of capacitance at the PCB trace. Designers often avoid the use of vias in high frequency applications because vias can add substantial capacitance to the interconnect system. When vias are unavoidable, designers typically structure them so as minimize their capacitance. Minimizing the bond wire and package leg inductance and capacitances of the bond pad and PCB can help increase the bandwidth, flatten frequency response and reduce the signal distortion, but it is not possible to completely eliminate interconnect system inductance and capacitance. Thus some level of signal distortion and attenuation is inevitable when signal frequencies are sufficiently high.

What is needed is a way to substantially improve the frequency response of the interconnect system so as to reduce distortion and attenuation of high frequency signals.

SUMMARY OF THE INVENTION

The present invention is an improvement to a conventional system for interconnected integrated circuits (ICs) mounted on a printed circuit board (PCB). The conventional interconnect system employs a conductor (typically a bond wire and package leg) to connect a bond pad on the surface of each IC to a PCB trace on the PCB so that the ICs can communicate with each other through the PCB trace. The inductance of the bond wires and package legs, the capacitances of the bond pads and PCB trace, the impedances of the IC devices connected to the pads, and impedances of the PCB trace cause the interconnect system to distort, reflect and attenuate signals as they pass between the IC bond pads.

In accordance with the invention, the interconnect system is improved by adapting it to provide a filter function that is optimized for the nature of the signals passing between the ICs. The interconnect system is adapted to provide a filter function, for example by adding capacitance to the circuit board PCB trace and by appropriately adjusting the bond wire inductance, the IC pad capacitance, and the additional circuit board capacitance relative to one another. The component values are adjusted to optimize relevant characteristics of the interconnect system frequency response. For example when the ICs communicate using low frequency analog signals where it is most important to avoid distortion, the "optimal" frequency response may have a narrow, but maximally flat, pass band. Or, as another example, when the ICs communicate via high frequency digital signals, the optimal frequency response may have a maximally wide passband. By adding capacitance to the circuit board PCB trace, rather than trying to minimize it, and by adjusting that capacitance relative to impedances of other components of the interconnect system, substantial improvement in interconnect system frequency response can be obtained.

It is accordingly an object of the invention to provide a system for interconnecting integrated circuits mounted on a printed circuit board wherein the frequency response of the interconnect system is optimized for the nature of signals passing between the ICs.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWING(S)

DESCRIPTION OF THE PREFERRED EMBODIMENT(S)

Prior Art Interconnect System

Figure 1:
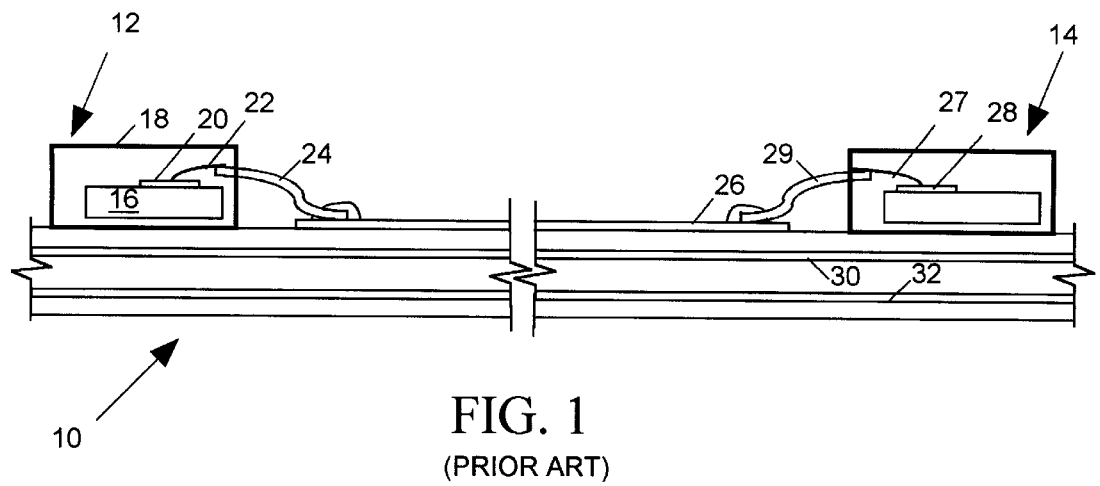
FIG. 1 is a simplified sectional elevation view of a portion of a prior art printed circuit board upon which is mounted a pair of integrated circuits.

The present invention is an improvement to a prior art interconnect system for conveying signals between integrated circuits mounted on a printed circuit board. FIG. 1 is a simplified sectional elevation view of the prior art interconnect system, including a printed circuit board (PCB) 10 upon which is mounted a pair of integrated circuits (ICs) 12 and 14. IC 12 includes an integrated circuit chip 16 contained within an IC package 18. A bond pad 20 on the surface of chip 16 acts as an input/output (I/O) terminal for signals entering and/or departing chip 16. A typical IC will include several bond pads, but for simplicity only one is shown in FIG. 1. A bond wire 22 links bond pad 20 to a conductive leg 24 extending outward from package 18. Leg 24 is typically soldered onto a microstrip PCB trace 26 on the surface of PCB 10. Bond wire 22 and leg 24 together form a path for conveying signals between bond pad 20 and PCB trace 26. When a bond pad 28 in IC 14 is connected to microstrip PCB trace 26 in a similar manner through a bond wire 27 and a package leg 29, ICs 12 and 14 can transmit signals to one another via PCB trace 26. PCB board 10 also includes a conductive ground plane 30 and a conductive power plane 32 between layers of dielectric material for delivering ground and power throughout PCB 10.

Figure 2:
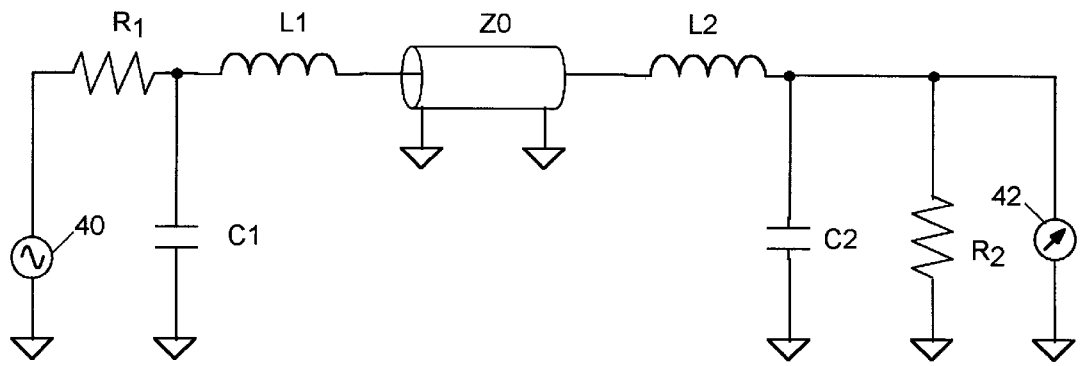
FIG. 2 is an equivalent circuit diagram modeling the ICs of FIG. 1 and the prior art structure interconnecting them.

FIG. 2 is an equivalent circuit diagram modeling PCB 10, ICs 12 and 14 of FIG. 1 and the various structures interconnecting them. IC 12 is modeled as an ideal signal source 40 transmitting a signal through a resistance $R_1$. The capacitance to ground at bond pad 20, including the capacitance of the driver and any electrostatic discharge (ESD) protection device connected to bond pad 20, is modeled as a single capacitor C1. Bond wire 22 and the package leg 24 form a transmission line that is primarily inductive at higher signal frequencies. Bond wire 22 and package leg 24 are therefore modeled as a single inductor L1. IC 14 is modeled as an ideal signal receiver 42 having input impedance $R_2$ connected to bond pad 28. The capacitance at bond pad 28, including the capacitance of any driver, ESD or other device connected to pad 28 is modeled as a capacitor C2. The inductances of bond wire 27 and 29 are modeled as a single inductor L2. Trace 26 is modeled as a microstrip transmission line having a series characteristic impedance Z0.

The circuit formed by capacitors C1, C2, inductors L1 and L2, resistors R1 and R2, and impedance Z0 has a reactive impedance that can substantially attenuate and distort signals passing between driver 40 and receiver 42. The conventional approach to reducing the amount of signal distortion and attenuation in high frequency applications has been to minimize bond wire inductances L1 and L2 and capacitances C1 and C2. Inductances L1 and L2 are minimized by keeping bond wires 20, 27 and package legs 24, 29 as small as possible. Capacitances C1 and C2 are minimized by keeping bond pads 20 and 28 as small as possible.

Table I below lists impedance values of the various interconnect system components of the prior art equivalent circuit of FIG. 2 that are typical in high frequency applications.

TABLE I

| ELEMENT | IMPEDANCE |
| --- | --- |
| L1 | 1nH |
| L2 | 1nH |
| C1 | 2pF |
| C2 | 2pF |
| Z0 | 50 Ohms |
| $R_1$ | 50 Ohms |
| $R_2$ | 50 Ohms |

Figure 3:
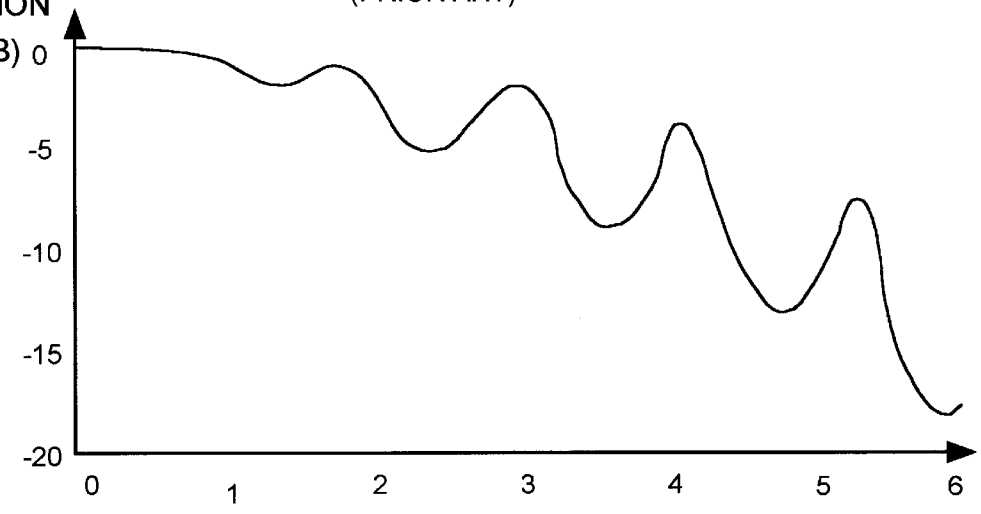
FIG. 3 illustrates the frequency response characteristics of the prior art interconnect system of FIGS. 1 and 2.

FIG. 3 illustrates the frequency response characteristics of the prior art interconnect system of FIGS. 1 and 2 when components are set to the values indicated in Table I. The desired frequency response characteristics for an interconnect system depends on its application. For example, when the interconnect system is to convey an analog signal with little distortion or noise, it is usually desirable that the passband be only as wide as needed to pass the highest frequency signal expected, that the passband be as flat as possible to avoid signal distortion, and that all areas of the stopband have maximal attenuation so as to block high frequency noise. Suppose we want to use the interconnect system of FIG. 2 to convey an analog signal having components up to 3 GHz. We first note that the passband (approximately 2 GHz) is not wide enough for the application. We also note that the passband is not particularly flat between 1 and 2 GHz. Thus the interconnect system will severely attenuate signal frequency components above 2 GHz and will distort signals having frequency components above 1 GHz. We also note that the stopband has large peaks at several frequencies above 2 GHz and may therefore fail to sufficiently attenuate noise at those frequencies.

Improved Interconnect System

Figure 4:
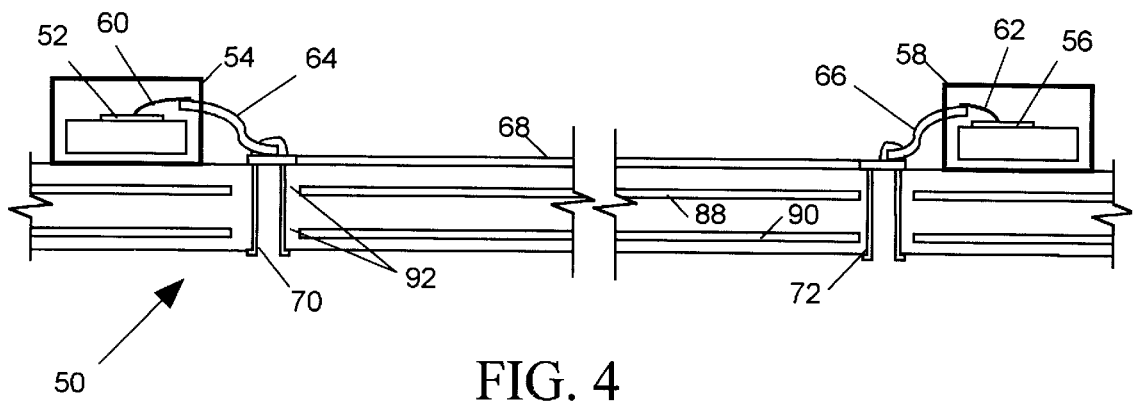
FIG. 4 is a simplified sectional elevation view of a portion of a printed circuit board upon which is mounted a pair of integrated circuits, wherein the integrated circuits are interconnected in accordance with the present invention.

FIG. 4 illustrates a PCB 50 implementing an improved interconnect system in accordance with the present invention for interconnecting a bond pad 52 in one IC 54 to a bond pad 56 in another IC 58. Bond wires 60 and 62 connect pads 52 and 56 to package legs 64 and 66 which are in turn soldered to a PCB trace 68 on the upper surface of PCB 50. A conductive via 70 passes through PCB 50 and contacts PCB trace 68 near the point of contact between leg 64 and PCB trace 68. Similarly a via 72 passes through PCB 50 and contacts PCB trace 68 near its point of contact with leg 66.

Figure 5:
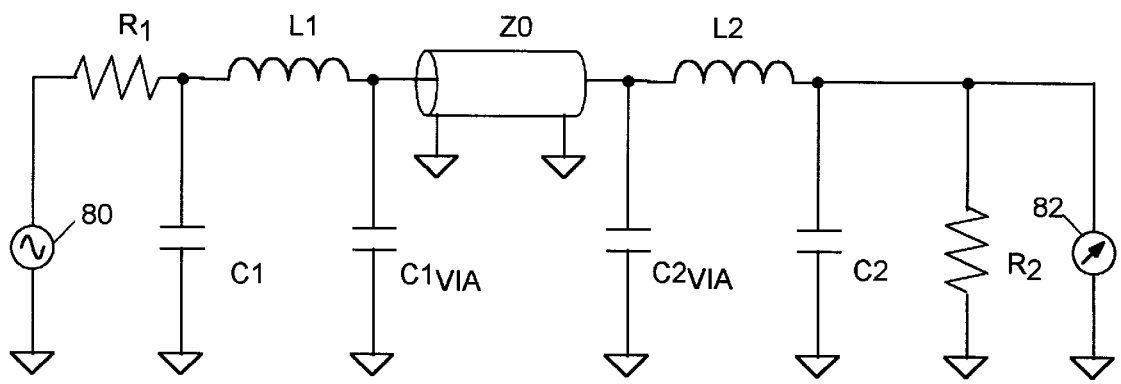
FIG. 5 is an equivalent circuit diagram modeling the ICs of FIG. 4 and the structure interconnecting them.

FIG. 5 is an equivalent circuit diagram of the interconnect system of FIG. 4 in accordance with the invention. A driver 70 within IC 54 is connected to pad 52 through impedance $R_1$ and a receiver having input impedance $R_2$ within IC 58 connected to pad 56. Bond wire 60 and package leg 64 are modeled as inductance L1 while bond wire 62 and package leg 66 are modeled as inductance L2. The capacitances of pads 52 and 56 appear in FIG. 5 as capacitors C1 and C2 and the impedance of PCB trace 68 appears as its characteristic impedance Z0. Since vias 70 and 72 are primarily capacitive, their capacitances appear in FIG. 5 as capacitors $C1_{VIA}$ and $C2_{VIA}$.

The interconnect system of 5 is topologically similar to the prior art system of FIG. 2 except for the addition of the shunt capacitors $C1_{VIA}$ and $C2_{VIA}$ at opposite ends of impedance Z0. Although vias 70 and 72 can be conveniently used to connect PCB trace 72 to traces on other layers of PCB 50, the primary function of vias 70 and 72 is to add relatively large shunt capacitances $C1_{VIA}$ and $C2_{VIA}$ to PCB trace 68. Thus in accordance with the invention, vias 70 and 72 (or any other suitable source of capacitance) are added to PCB trace 68 regardless of whether the vias are used to connect PCB trace 68 to traces on other layers of PCB 50.

According to conventional practice interconnect system frequency response is optimized by minimizing shunt capacitance at the trace 68, mainly by avoiding connection of capacitive elements such as vias to the trace, and by minimizing series inductances L1 and L2, mainly by keeping conductors 60, 62, 64 and 66 as short as possible. However in accordance with the invention, system frequency response is actually improved by adding capacitances $C1_{VIA}$ and $C2_{VIA}$ to trace 68 and/or by increasing inductances L1 and L2 above their minimum levels, provided that the values of L1, L2, $C1_{VIA}$, and $C2_{VIA}$ are appropriately adjusted relative other components values C1, C2, R1, R2 and Z0 of the interconnect system, The capacitance $C1_{VIA}$ and $C2_{VIA}$ of each via 70 and 72 arises primarily from capacitive coupling between the via and the ground and power planes 88 and 90 of PCB 58 and can be controlled by altering the distance between the vias and planes 88 and 90. In particular we can increase (or decrease) capacitance $C1_{VIA}$ of via 70 by decreasing (or increasing) the size of the holes 92 in planes 88 and 90 through which via 70 passes. The capacitance $C1_{VIA}$ of via 72 can be adjusted in a similar manner. The magnitudes of L1 and L2 can be increased by increasing the lengths of bond wires 60 and 62, increasing the lengths of package legs 64 and 66, or by adding inductive elements in series with bond wires 60 and 62.

Table II compares values of interconnect system components of the prior art equivalent circuit of FIG. 2 to values of interconnect system components of the improved interconnect system of FIG. 5 when adjusted in accordance with the invention:

TABLE II

| ELEMENT | VALUE (PRIOR ART) | VALUE (IMPROVED) |
| --- | --- | --- |
| L1 | 1nH | 3nH |
| L2 | 1nH | 3nH |
| C1 | 2pF | 2pF |
| C2 | 2pF | 2pF |
| $C1_{VIA}$ | N/A | 1.4pF |
| $C2_{VIA}$ | N/A | 1.4pF |
| Z0 | 50 Ohms | 50 Ohms |
| $R_1$ | 50 Ohms | 50 Ohms |
| $R_2$ | 50 Ohms | 50 Ohms |

Component values for Z0, R1 and R2, C1 and C2 are characteristics of the ICs and are assumed for illustrative purposes to have similar values for both prior art and improved interconnect systems. However the improved interconnect system includes the additional capacitances $C1_{VIA}$ and $C2_{VIA}$. Inductances L1 and L2 are also increased from 1 nH in the prior art interconnect system of FIG. 2 to 3 nH in the improved interconnect system of FIG. 5.

Figure 6:
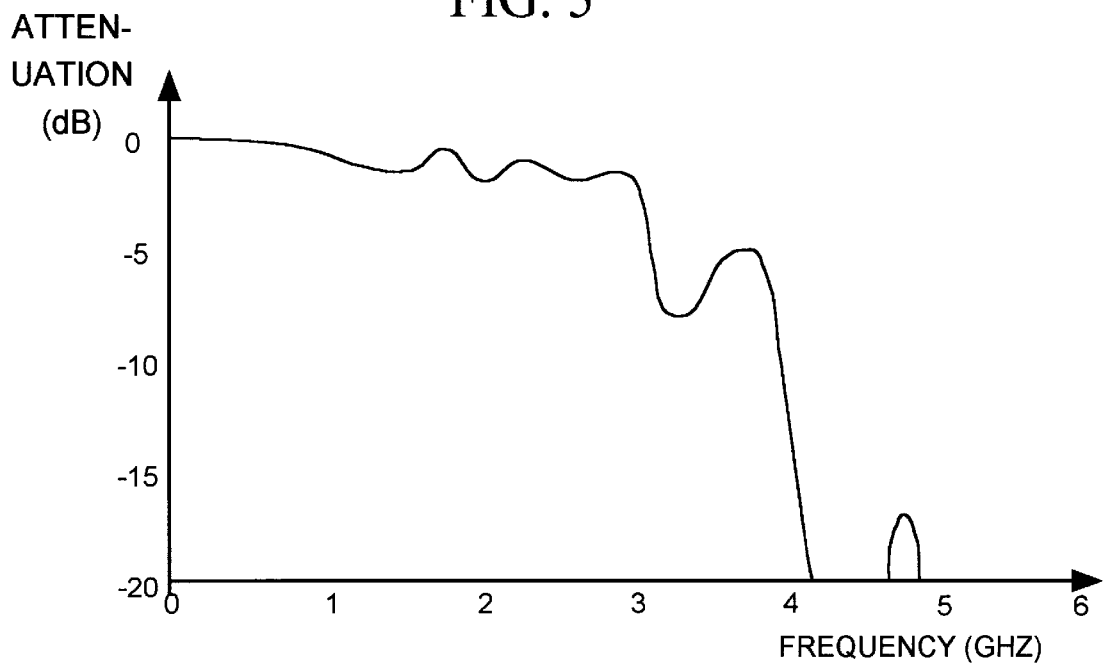
FIG. 6 illustrates the frequency response characteristics of the interconnect system of FIGS. 4 and 5.

FIG. 6 illustrates the frequency response of the interconnect system of FIG. 5 in accordance with the invention when its various component are set to the values indicated by the "improved" column of Table II. In the particular case illustrated in FIG. 6 the value of L1, L2, $C1_{VIA}$, and $C2_{VIA}$ were chosen to maximize passband power for the given values of R1, R2, C1, C2 and Z0. We maximize passband power when we maximize the average amount of signal power that may be conveyed by the various signal frequencies in the interconnect system passband (0–3 GHz). This means that for the given values of other components of FIG. 5, L1, L2, $C1_{VIA}$ and $C2_{VIA}$ are sized to maximize the total area under the frequency response curve in the passband between 0 and 3 GHz. One way to determine appropriate values of L1, L2, $C1_{VIA}$ and $C2_{VIA}$ is to use a conventional circuit simulator to simulate the circuit of FIG. 5 which produces a plot of frequency response similar to FIG. 6. The values of L1, L2, $C1_{VIA}$ and $C2_{VIA}$ that maximize passband power can be determined by iteratively adjusting their values and monitoring the frequency response.

FIG. 6 shows that the bandwidth of the improved interconnect system is approximately 3 GHz, substantially larger than the 2 GHz bandwidth of the prior art system, as illustrated in FIG. 3. Note also that the passband is relatively flatter in FIG. 6, that the stopband falls off more quickly in FIG. 6 than in FIG. 3, and that the stopband of FIG. 6 has fewer spikes. It is clear that the frequency response illustrated in FIG. 6 would be an improvement over the frequency response of FIG. 3 in an application where a 3 GHz passband is required. Thus in this case the passband power characteristic of the frequency response of the interconnect system is optimized not by providing only minimal capacitance at the PCB trace and minimal series inductance L1 and L2 as practiced in the prior art, but by providing appropriately adjusted additional capacitance $C1_{VIA}$ and $C2_{VIA}$ at the PCB trace and by appropriately increasing L1 and L2 above their minimum levels.

Butterworth and Chebyshev Filters

It should be understood that the frequency response of an interconnect system has many characteristics and that its "optimal" frequency response is application-dependent. Thus the appropriate value to which the additional PCB capacitances $C1_{VIA}$ and $C2_{VIA}$ and inductances L1 and L2 should be adjusted depends on which frequency response and impedance characteristics are most important for the particular application. In the example of FIG. 6, $C1_{VIA}$, $C2_{VIA}$, L1 and L2 were chosen to maximize the passband power. However other values of $C1_{VIA}$, $C2_{VIA}$, L1 and L2 can optimize other characteristics of the interconnect system. For example when the interconnect system is to convey a lower frequency analog signal with minimal distortion, and where band width is not so important, it may be desirable that the frequency response of the interconnect system have a "maximally flat" passband, having the least possible amount of ripple.

It is beneficial to think of the equivalent circuit of the interconnect system, as illustrated in FIG. 5, as a multiple pole filter. By appropriately adjusting $C1_{VIA}$, $C2_{VIA}$ L1 and L2 relative to C1, C2 and the other components of the interconnect system, the interconnect system can be made to behave, for example, like a well-known, multi-pole "Butterworth" filter which provides a maximally flat frequency response.

In other applications, optimal frequency response will be a tradeoff between the bandwidth, allowable passband ripple, and stopband attenuation. Accordingly the values of $C1_{VIA}$, $C2_{VIA}$, L1 and L2 can be selected so that the interconnect system behaves as a form of the well-known, multiple-pole Chebyshev filter. The design of multi-pole Butterworth and Chebyshev filters, including appropriate choices for component values so as to optimize one or more combinations of characteristics of filter's frequency response, is well-known to those skilled in the art. See for example, pages 59–68 of the book *Introduction to Radio Frequency Design* by W. H. Hayward, published 1982 by Prentice-Hall, Inc., and incorporated herein by reference.

Adjusting Other Components

It is possible to further optimize the frequency response of the interconnect system of FIG. 5 when we also have the freedom to adjust values of other components R1, R2, Z0, C1 and C2. However in practice the values of $R_1$, $R_{2\ and\ Z}0$ are typically standardized by IC and PCB manufacturers to 50 ohms in high frequency applications. Capacitances C1 and C2 can be adjusted, but only by IC manufacturers, and they typically try to minimize C1 and C2. Via capacitances $C1_{VIA}$ and $C2_{VIA}$, or other sources of shunt capacitance that may be connected to the trace, and series inductances L1 and L2 may therefore be the only components of the interconnect system of FIG. 5 that are conveniently adjustable in the manner described above. However it should be understood that, where possible, any or all component values of the interconnect system of FIG. 5 can be adjusted in order to optimize its frequency response and that when we have more latitude in adjusting component values, we can attain a higher level of optimization of frequency response.

Impedance Matching

Driver output impedance R1, receiver input impedance R2 and trace impedance Z0 are typically set to similar values (e.g., 50 Ohms) to prevent signal reflections which degrade system frequency response. However in accordance with the invention, it is not necessary that $R1=R2=Z_0$ because we can compensate for impedance mismatching by appropriately adjusting L1, L2, $C2_{VIA}$ and $C2_{IA}$. For example pages 59–68 of the above-mentioned book *Introduction to Radio Frequency Design* illustrate how to adjust other filter component values to obtain Butterworth and Chebyshev filter frequency response behavior even when R1, R2 and Z0 are dissimilar.

Other Sources of Adjustable PCB Capacitance

In the interconnect system of FIG. 4, the necessary additional PCB capacitance is obtained by providing appropriately dimensioned vias 70 and 72. This is a convenient and inexpensive way of providing such capacitance because most PCB manufactures have the capability of adding appropriately sized vias to a PCB. Use of vias to provide this capacitance has the added benefit of allowing signals to travel to PCB traces such as PCB traces (not shown in FIG. 4) on other PCB layers, thereby adding to the flexibility with which a designer can lay out a high frequency PCB. It should be understood, however, that while the necessary PCB capacitance can be conveniently obtained by using vias 70 and 72, such additional capacitance can also be provided by other means, for example by connecting appropriately sized discrete capacitors between PCB trace 68 and ground plane 88.

While the forgoing specification has described preferred embodiment(s) of the present invention, one skilled in the art may make many modifications to the preferred embodiment without departing from the invention in its broader aspects. For example, while in the preferred embodiment the interconnect system employs bond wires 22 and 27 and package legs 24 and 29 to connect nodes of ICs 12 and 14 to PCB trace 26, other types of inductive conductors, such as for example spring wires, could be employed to connect nodes of an integrated circuit to a PCB trace. Also, the interconnect system of the present invention may be employed to interconnect circuits other than integrated circuits. The appended claims therefore are intended to cover all such modifications as fall within the true scope and spirit of the invention.

What is claimed is:

1. A method for substantially optimizing a characteristic of a frequency response of an interconnect system for conveying a signal between a node of an integrated circuit and a printed circuit board (PCB) trace, wherein the interconnect system comprises a bond pad connected to said node and a conductive path linking said bond pad to said PCB trace, the method comprising the steps of:

ascertaining inductances and capacitances of said bond pad, said conductive path and said PCB trace, determining from the ascertained inductances and capacitances a magnitude of shunt capacitance which when added to said PCB trace will substantially optimize said frequency response characteristic, and adding said shunt capacitance of said magnitude to said PCB trace.

2. The method in accordance with claim 1 wherein the step of adding shunt capacitance of said magnitude to said PCB trace comprises the step of connecting a capacitive element to said PCB trace.

3. A method for substantially optimizing a characteristic of a frequency response of an interconnect system connecting a node of an integrated circuit to a printed circuit board (PCB) trace, wherein the interconnect system comprises a bond pad connected to said node and a conductive path linking said bond pad to said PCB trace, the method comprising the step of adding shunt capacitance to said PCB trace, said capacitance being sized to substantially optimize said frequency response characteristic, wherein said capacitive element comprises a via connected to said PCB trace.

4. The method in accordance with claim 1 wherein said frequency response characteristic is one of maximal passband width, maximal passband flatness and maximal passband power.

5. The method in accordance with claim 1 wherein said shunt capacitance added to said PCB trace is sized so that said interconnect system acts substantially as a multiple-pole Butterworth filter.

6. The method in accordance with claim 1 wherein said shunt capacitance added to said PCB trace is sized so that said interconnect system acts substantially as a multiple-pole Chebyshev filter.

7. The method in accordance with claim 1 further comprising the step of adding series inductance to said conductive path, said series inductance and said shunt capacitance being sized to substantially optimize said frequency response characteristic.

8. The method in accordance with claim 7 wherein the step of adding series inductance to said conductive path comprises increasing a length of said conductive path.

9. The method in accordance with claim 8 wherein said shunt capacitance and series inductance are sized so that said interconnect system acts substantially as a multiple-pole Butterworth filter.

10. The method in accordance with claim 8 wherein said shunt capacitance and series inductance are sized so that said interconnect system acts substantially as a multiple-pole Chebyshev filter.

11. A method for substantially optimizing a characteristic of a frequency response of an interconnect system for conveying a signal between a node of an integrated circuit and a printed circuit board (PCB) trace, wherein the interconnect system comprises a bond pad connected to said node and a conductive path linking said bond pad to said PCB trace, the method comprising the steps of:

ascertaining inductances and capacitances of said bond pad, said conductive path and said PCB trace, determining from the ascertained inductances and capacitances a magnitude of series inductance which when added to said conductive path will substantially optimize said frequency response characteristic, and adding said series inductance capacitance of said magnitude to said conductive path.

12. The method in accordance with claim 11 wherein the step of adding series inductance of said magnitude to said conductive path comprises increasing a length of said conductive path.

13. The method in accordance with claim 11 wherein said series inductance is sized so that said interconnect system acts substantially as a multiple-pole Butterworth filter.

14. The method in accordance with claim 11 wherein said series inductance is sized so that said interconnect system acts substantially as a multiple-pole Chebyshev filter.

15. A method for optimizing a characteristic of a frequency response of an interconnect system interconnecting a driver on a first integrated circuit (IC) to a receiver on a second IC, wherein the interconnect system comprises a printed circuit board (PCB) trace, a first bond pad implemented on said first IC and connected to said driver, a first conductor linking said first bond pad to said PCB trace, a second bond pad implemented on said second IC and connected to said receiver, and a second conductor linking said second bond pad to said PCB trace, the method comprising the steps of
 attaching a first capacitive element to said PCB trace near a first point of contact between said first conductor and said PCB trace; and
 attaching said second capacitive element to said PCB trace near a second point of contact between said second conductor and said PCB trace,
 wherein capacitances of said first and second capacitive elements are sized to substantially optimize said frequency response characteristic.

16. The method in accordance with claim 15 wherein said first and second capacitive elements comprise vias.

17. The method in accordance with claim 15 wherein said first and second capacitive element comprise discrete capacitors.

18. The method in accordance with claim 15 wherein said frequency response characteristic is one of maximal passband width, maximal passband flatness, and maximal passband power.

19. The method in accordance with claim 15 wherein capacitances of said first and second capacitive elements are sized so that said interconnect system acts substantially as a multiple-pole Butterworth filter.

20. The method in accordance with claim 15 wherein said capacitances of said first and second capacitive elements are sized so that said interconnect system acts substantially as a multiple-pole Chebyshev filter.

21. The method in accordance with claim 15 further comprising the step of
 adjusting inductances of said first and second conductors to substantially optimize said frequency response characteristic.

22. The method in accordance with claim 21 wherein the step of adjusting inductances of said first and second conductors comprises adjusting lengths of said first and second conductors.

23. The method in accordance with claim 20 wherein said frequency response characteristic is one of maximal passband width, maximal passband flatness, and maximal passband power.

24. The method in accordance with claim 20 wherein capacitances of said first and second capacitive elements are sized so that said interconnect system acts substantially as a multiple-pole Butterworth filter.

25. The method in accordance with claim 20 in said capacitances of said first and second capacitive elements are sized so that said interconnect system acts substantially as a multiple-pole Chebyshev filter.

26. A method for optimizing a characteristic of a frequency response of an interconnect system interconnecting a driver on a first integrated circuit (IC) to a receiver on a second IC, wherein the interconnect system comprises a printed circuit board (PCB) trace, a first bond pad implemented on said first IC and connected to said driver, a first conductor linking said first bond pad to said PCB trace, a second bond pad implemented on said second IC and connected to said receiver, and a second conductor linking said second bond pad to said PCB trace, the method comprising the step of adjusting inductances of said first and second conductors to substantially optimize said frequency response characteristic.

27. The method in accordance with claim 26 wherein the step of adjusting inductances of said first and second conductors comprises adjusting lengths of said first and second conductors.

28. An interconnect system for conveying a signal between and internal node of an integrated circuit and external node, the interconnect system comprising:
 a bond pad connected to said internal node;
 a PCB trace connected to said external node;
 a conductive path linking said bond pad to said PCB trace; and
 at least one capacitive element connected to said PCB trace,
 wherein said integrated circuit provides first shunt capacitance and first series resistance at said bond pad,
 wherein said conductive path provides first series inductance between said bond pad and said PCB trace;
 wherein said PCB trace has an inherent first shunt capacitance;
 wherein said at least one capacitive element adds second shunt capacitance to said trace;
 wherein said bond pad, said conductive path, said PCB trace, and said capacitive element form a filter for conducting said signal between said bond pad and said PCB trace, and
 wherein said second shunt resistance and first series inductance are sized in relation to said second series inductance, said first shunt capacitance and said load resistance to substantially optimize a frequency response characteristic of said filter.

29. An interconnect system for interconnecting a node of an integrated circuit to a printed circuit board (PCB) trace, the interconnect system comprising:
 a bond pad connected to said node;
 a conductor having inductance linking said bond pad to said PCB trace; and
 a capacitive element having capacitance connected to said PCB trace,
 wherein the capacitance of said capacitive element and the inductance of said conductor are adjusted to substantially optimize a frequency response characteristic of said interconnect system,
 wherein said capacitive element comprises a via connected to said PCB trace.

30. The interconnect system in accordance with claim 28 wherein said inductance is adjusted by increasing a length of said conductive path substantially beyond a minimum practical length needed to interconnect said node and said PCB trace.

31. An interconnect system for interconnecting a first circuit implemented in a first integrated circuit (IC) and having output resistance and output capacitance to a second circuit implemented in a second IC and having input resistance and input capacitance, the interconnect system comprising:

a printed circuit board (PCB) trace having a characteristic impedance, a first bond pad implemented on said first IC and connected to said first circuit, a first conductor linking said first bond pad to said PCB trace, a second bond pad implemented on said second IC and connected to said second circuit, a second conductor linking said second bond pad to said PCB trace, a first capacitor attached to said PCB trace, and a second capacitor element attached to said PCB trace, wherein capacitances of said first and second capacitors and inductances of said first and second conductors are sized relative to said output and input resistances, to said first and second capacitances, to said characteristic impedance, and to said input and output capacitances so as to substantially optimize a characteristic of a frequency response of said interconnect system.

32. The interconnect system in accordance with claim 31 wherein said first capacitor is attached to said PCB trace near a first point of contact between said first conductor and said PCB trace, and wherein said second capacitor is attached to said PCB trace near a second point of contact between said second conductor and said PCB trace.

33. The interconnect system in accordance with claim 31 wherein said first and second capacitors comprise vias.

34. The interconnect system in accordance with claim 31 wherein said frequency response characteristic is one of maximal passband width, maximal passband flatness and maximal passband power.

35. The interconnect system in accordance with claim 31 wherein said capacitances of said first and second capacitors and inductances of said first and second conductors are sized so that said interconnect system operates substantially as a multiple-pole Butterworth filter.

36. The interconnect system in accordance with claim 31 wherein said capacitances of said first and second capacitors and inductances of said first and second conductors are sized so that said interconnect system operates substantially as a multiple-pole Chebyshev filter.

37. The interconnect system in accordance with claim 31 wherein the characteristic impedance of said trace substantially matches said input and output resistances.

38. The interconnect system in accordance with claim 31 wherein said characteristic impedance of said trace does not substantially match at least one of said input and output resistances.

39. The interconnect system in accordance with claim 31 wherein said input and output resistances are substantially dissimilar.

* * * * *